United States Patent [19]

Fujita et al.

[11] 4,024,416

[45] May 17, 1977

[54] METHOD FOR CONTROLLING FREQUENCY OF ELECTRICAL OSCILLATIONS AND FREQUENCY STANDARD FOR ELECTRONIC TIMEPIECE

[75] Inventors: Hiro Fujita, Sayama; Shigeru Morokawa, Higashiyamato; Akira Tsuzuki, Tokyo, all of Japan

[73] Assignee: Citizen Watch Co., Ltd., Tokyo, Japan

[22] Filed: May 10, 1976

[21] Appl. No.: 685,192

[30] Foreign Application Priority Data

June 5, 1975 Japan .............................. 50-67819

[52] U.S. Cl. ................................ 307/269; 307/208; 307/205; 307/216; 307/232; 58/23 A; 328/61; 328/133

[51] Int. Cl.² ..................... H03K 3/353; H03K 1/17

[58] Field of Search ............... 58/23 A, 23 R, 50 R; 328/60, 61, 63, 134, 133; 307/216, 271, 269, 208, 205, 232

[56] References Cited

UNITED STATES PATENTS

| | | | |
|---|---|---|---|
| 3,124,755 | 3/1964 | Williamson et al. | 328/134 |
| 3,510,783 | 5/1970 | Smith | 307/269 X |
| 3,512,351 | 5/1970 | Shelley et al. | 58/23 A |
| 3,514,705 | 5/1970 | Feigleson | 328/133 |
| 3,870,900 | 3/1975 | Malaviya | 307/232 |
| 3,978,649 | 9/1976 | Naito | 58/23 R |

*Primary Examiner*—John S. Heyman

*Attorney, Agent, or Firm*—Frank J. Jordan

[57] ABSTRACT

A frequency standard for an electronic timepiece comprising a low frequency oscillator and a high frequency oscillator of which the frequency is an integral multiple of a predetermined frequency of the lower frequency oscillator. A phase difference detector is coupled to the lower and higher frequency oscillators to produce a signal occurring at intervals depending on the phase difference between the two oscillators. A frequency divider is provided to divide down the frequency of the signal by the integral multiple to produce a phase difference signal. The phase difference signal is algebraically added to the lower frequency oscillator signal to generate an output signal of which frequency is equal to that of the high or frequency oscillation signal divided by the integral multiple.

22 Claims, 17 Drawing Figures

METHOD FOR CONTROLLING FREQUENCY OF ELECTRICAL OSCILLATIONS AND FREQUENCY STANDARD FOR ELECTRONIC TIMEPIECE

The present invention relates generally to electrical oscillators, and in particular to an electrical oscillator specifically designed for use in electronic timepieces where frequency stability and low power consumption are of primary concern.

In electronic timepieces and wristwatches, a signal at a frequency of 32,768 Hz is generally used as a primary frequency source from which is derived timekeeping pulses at a frequency of 1 Hz. From frequency stability considerations it is desirable that the frequency of the primary source be as high as possible. However, from the standpoint of power consumption it is undesirable to use a signal much higher in frequency than 32 kHz, since this results in a need for an increase in the number of stages required for frequency division, which will result in an increase in power consumption.

U.S. Pat. No. 3,512,351 issued to J. H. Shelley, discloses an electrical oscillator using both a low frequency signal source and a high frequency signal source. The phase difference between the signals from the lower and higher frequency sources is measured, and an output signal is generated proportional to the phase difference between the high and low frequency signals. A phase difference signal is derived from the phase information and fed back to the lower frequency signal source to adjust it to the correct frequency, in a closed loop mode.

However, closed loop control frequency stabilization has disadvantages in that, due to the inherent time delay in the feedback loop between the time of occurrence of a frequency change and the time of application of an error signal, overcorrection for the phase difference can occur resulting in "hunting". This problem is especially serious when the control loop is disturbed by external factors.

It is, therefore, an object of the present invention to provide an open loop controlled electrical oscillator which is free from the disadvantages inherent in oscillators of the prior art.

Another object of the invention is to provide an electrical oscillator or frequency standard for an electronic timepiece, in which lower and higher frequency oscillation signals are compared in phase to develop a train of pulses occurring at intervals depending on the phase difference between the two oscillator signals. These pulses are frequently divided to provide a phase difference signal which is added algebraically to the lower frequency oscillation signal to generate an accurate time standard signal.

In accordance with the present invention, the higher frequency is selected to be an integral multiple of a predetermined lower frequency. The phase difference between the two osciallator signals is detected by a phase difference detector. It will be appreciated that where reference is made to determination of relative phase difference between the two oscillation signals at a particular time, changes of relative phase by integral multiples of $2\pi$ radians arising prior to that time are ignored. If there is a constant frequency difference between the two oscillator signals, then the phase difference will vary periodically. The phase difference detector will produce a signal at this periodicity. A frequency divider divides the frequency of this signal by the integral multiple to produce a phase difference signal which is added algebraically to the lower frequency oscillator signal.

These and other objects, features and advantages of the present invention will be understood from the following description taken in conjunction with the accompanying drawings, in which.

Figure 1:
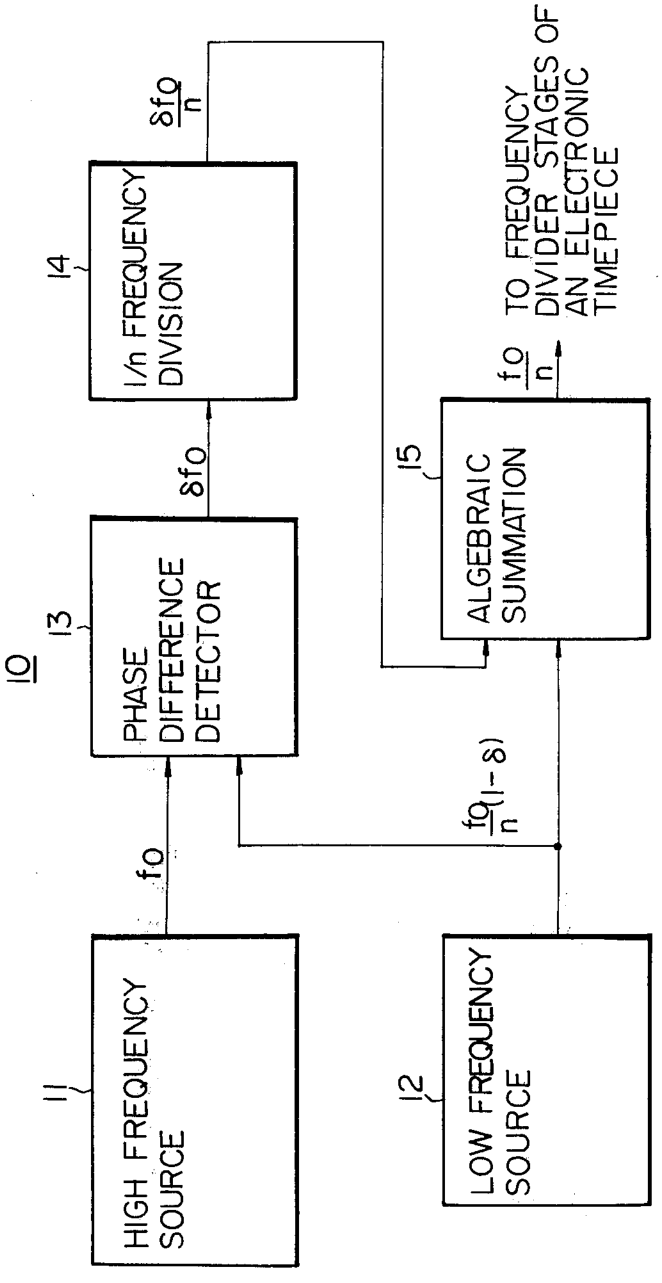
FIG. 1 is a schematic illustration of the principle of the present invention.
Figure 2:
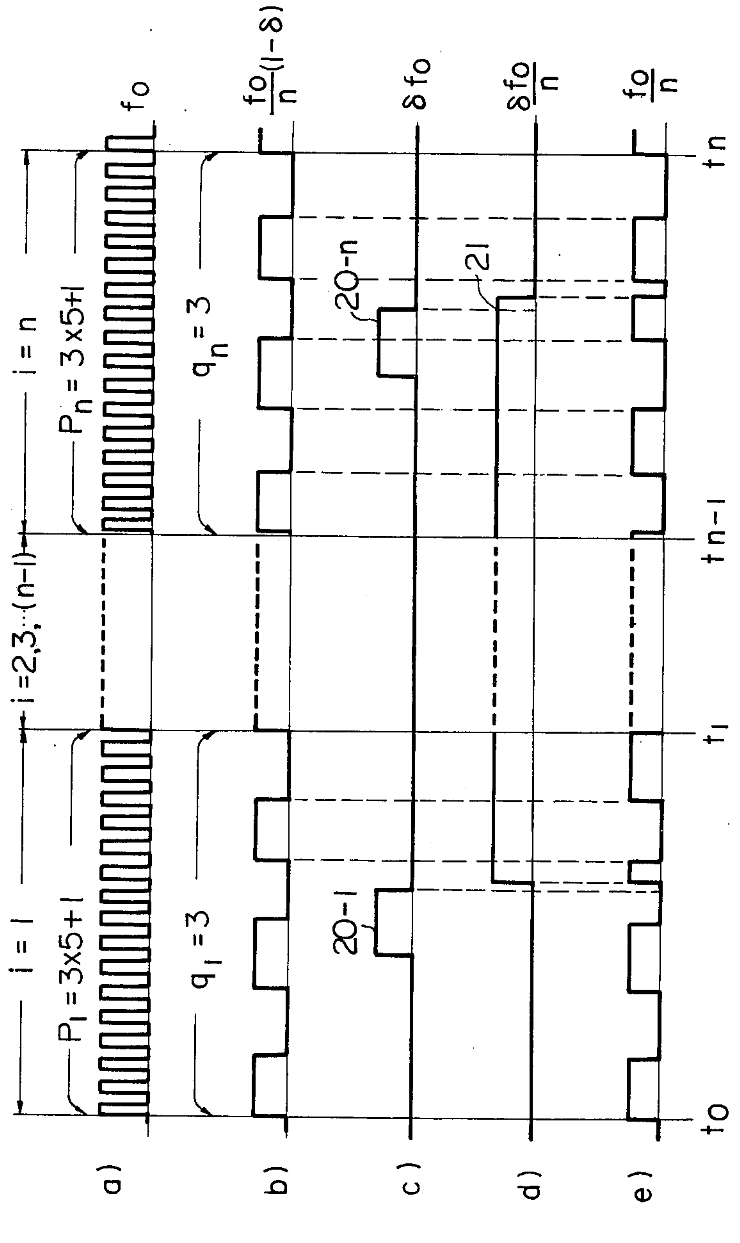
FIG. 2 illustrates a series of waveforms referred to in the illustration of FIG. 1.

Before discussing the embodiments of the present invention, the principle of the present invention will be described in conjunction with FIGS. 1 and 2 of the drawings. In FIG. 1, there is illustrated a frequency standard 10 for electronic timepieces or wristwatches which comprises generally a high frequency source 11 generating electrical oscillations at a frequency $f_o$, i.e., a basic timing signal, a low frequency source 12 generating electrical oscillations, a phase difference detector 13, a frequency divider 14 and an algebraic adder circuit 15. The high frequency source 11 and the low frequency source 12 are arranged to independently generate electrical oscillation signals at high and low frequencies, respectively. The frequency and frequency stability of the source 12 are maintained within a restricted range of values, the predetermined value being $1/n$ th of the higher frequency $f_o$ and the actual frequency being expressed by $$f_o/n\ (1 - \delta)$$

where, $\delta$ is the factor of frequency deviation from the predetermined frequency and represents the absolute number less than 1, and $n$ is an integer. It is to be noted that the phase difference signal is added to or subtracted from the lower frequency oscillator signal in dependence on whether $\delta$ has a positive or negative value. The phase difference detector 13 receives the two oscillation signals from the higher and lower frequency sources 11 and 12 and generates an output signal whose frequency is $\delta f_o$. This frequency may be obtained from an analog circuit by multiplying the lower frequency by the factor n to obtain $f_o\ (1 - \delta)$ and mixing it with the higher frequency $f_o$, so that the beat frequency $\delta f_o$ results. However, this analog approach is undersirable because of the inaccuracy inherent in the process of frequency multiplication. As will be described in detail hereinbelow, the phase difference detector 13 comprises a digital phase comparator. If the lower frequency is maintained at exactly the desired value $f_o/n$, the phase difference detector 13 will produce no output, since the number of cycles of the higher frequency oscillation signal is at the integral multiple ($n$) of the number of cycles of the lower frequency oscillator signal during a given interval of time. If the lower frequency varies such that the number of cycles of the higher frequency oscillator signal is greater or less than the integral multiple of the cycles of the lower frequency oscillator signal by a single cycle during a certain length of time, a phase difference signal will be produced from the phase difference detector 13. This is illustrated in FIG. 2, wherein it is assumed for illustrative purposes that $n=5$ and that 16 cycles of the higher frequency oscillator signal and 3 cycles of the lower frequency oscillator signal occur during the interval between times $t_0$ and $t_1$ (FIGS. 2*a* and 2*b*). Output signal 20-1 from the phase difference detector 13 represents that an excess cycle of the higher frequency oscillator signal has occurred during that interval. If the frequency deviation factor is constant with respect to time, a phase difference signal will be produced during each of the successive intervals $t_1t_2, \ldots t_{n-1}-t_n$. The frequency divider 14 divides the frequency of the output signals from the phase difference detector 13 by the factor n so that a phase difference single pulse 21 is generated during the interval between $t_0$ and $t_n$. Since $n$ excess cycles of the higher frequency oscillation signal occur during times $t_0$ to $t_n$, a phase difference signal 21 from the frequency divider 14 represents that the lower frequency has been too low in frequency by one cycle during that interval. Output signal 21 is a true phase difference signal, which is added to the lower frequency oscillation signal in the algebraic summation circuit 15. The above discussion can be expressed mathematically. The number of cycles occurring at the higher and lower oscillator frequencies is given by $$p_i = n.\, q_i \pm 1 \quad (1)$$

where $p_i$ and $q_i$ are integers and indicate the number of cycles of electrical oscillator signals occurring at the higher and lower frequencies, respectively, during the $i$th interval.

The total number of cycles of oscillation that have occurred during $i$ intervals is $$\sum_i p_i = n \sum_i q_i \pm i \quad (2)$$

At the $n$th interval the total number of oscillation cycles at the higher frequency is $$\sum_{i=1}^{n} p_i = n\left(\sum_{i=1}^{n} q_i \pm 1\right) \quad (3)$$

where $p_i$ and $q_i$ are variables.

The total number of oscillation cycles at the lower frequency is $$\sum_{i=1}^{n} q_i \quad (4)$$

The signals represented by Equations (3) and (4) are coupled to the phase difference detector 13, which produces n cycles during the n time intervals. It is desirable that the frequency variation characteristics of the low frequency source 12 are such that is has a tendency to drift in frequency in a single direction, preferably downwards in frequency, so that it is only necessary to add the phase difference signal to the lower frequency oscillation signal by the use of an adder circuit. The signals represented by Equations (3) and (4) are coupled to the phase difference detector 13 which produces an output signal which is divided down to produce a phase difference signal. This signal is coupled to the algebraic summation circuit 15, which produces $$\sum_{i=1}^{n} qi \pm 1$$

during the $n$ time intervals. This value is accurately equal to the value of the high frequency oscillation signal divided by $n$.

If the output of frequency divider 14 which divides the output signal from the phase difference detector 13 by the factor $n$ is added algebraically to the low frequency oscillator signal, an accurate time information signal is obtained at $n$ the intervals. This time information signal is divided down by suitable stages of counters to a lower frequency signal indicative of a time standard signal.

As already noted hereinabove, the frequency standard of the present invention makes it possible to obtain an accurate time standard signal with low power dissipation without using a frequency divider circuit of multiple stages for the high frequency oscillator. More particularly, the present invention features to divide the phase difference signal between the high frequency oscillator signal and the low frequency oscillator signal by the factor n in place of directly dividing the high frequency oscillator signal so that the power consumption is significantly eliminated. Error cycle ΔT which is acceptable with respect to the cycle T of the low frequency oscillator may be in varying ranges in dependence on the capacity of the phase difference detector 13 by which noises are eliminated. Assume $T \pm \Delta T = (1/fo)\ (n + \Delta\delta)$, it is undesirable that the value of $\delta o + \Delta\delta$ is greater than 1. Since it is difficult to eliminate noises when $\delta o$ is close to ½, it is desirable to select a low value of $\delta o$. In order to arrange the adder circuit 15 in the simplest form, it is required that the value of $\delta o + \Delta\delta$ be positive number less than 1. Accordingly, if $\delta o = 1/4$ and $\Delta\delta < 1/4$, $\Delta T < (1/4fo)$, and hence $$(\Delta T/T < (f1/4fo) = (1/4n)$$

where $f1$ is the output frequency of the low frequency oscillator 12.

From the above relation, it will be seen that the oscillating stability of the low frequency oscillator is dependent upon the rate of division and the number of oscillation cycles at the lower frequency at a given interval of time. It is desired that the frequency variation factor be less than ¼$n$. This means that a wider range of frequency variation and frequency stability is permissible when the lower frequency is closer to the higher frequency, but because of the greater number of stages which may be necessitated by a small value of $n$ it is preferable from the power consumption standpoint to select a high value of $n$.

Figure 3:
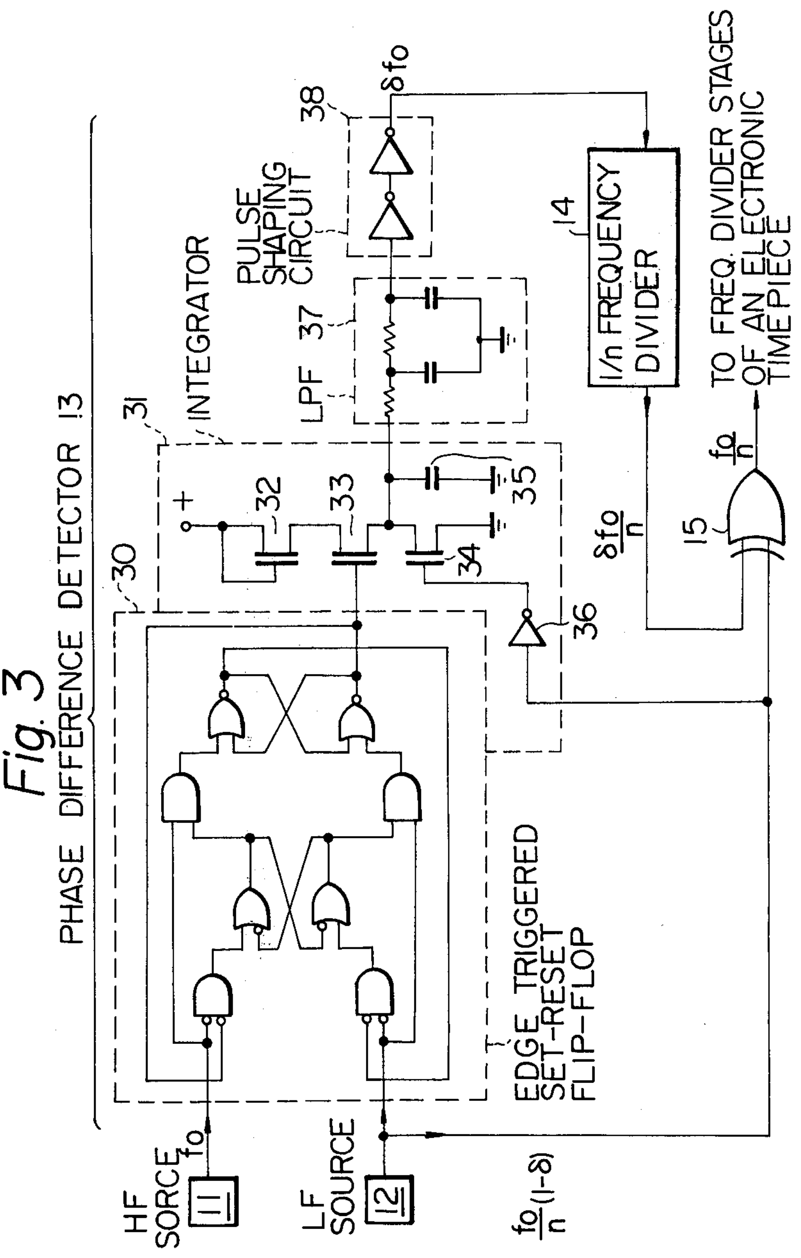
FIG. 3 is a first embodiment of the invention.
Figure 4:
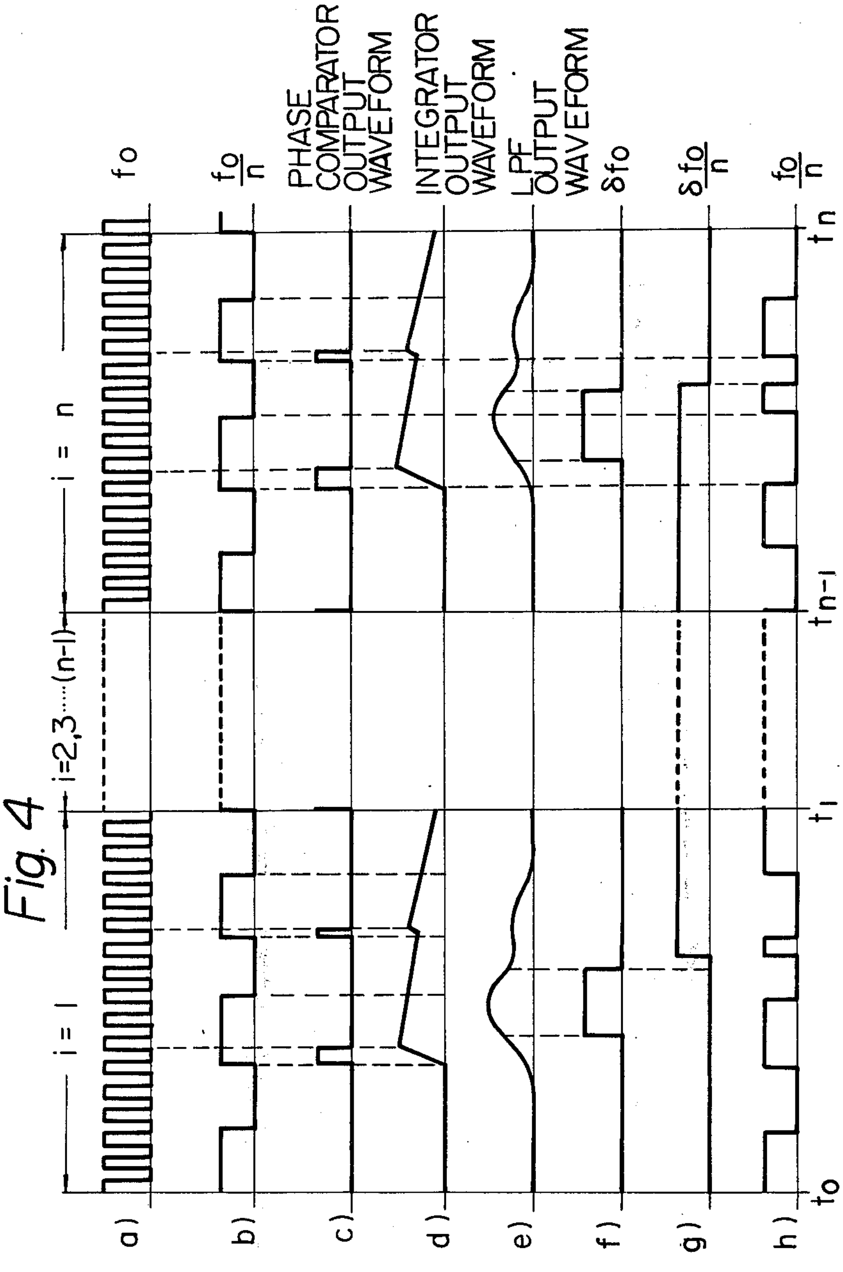
FIG. 4 is an explanatory waveform diagram for the first embodiment of FIG. 3.

The principle of the present invention is realized in a first embodiment of the present invention as illustrated in FIG. 3, which will be explained in connection with FIG. 4. Frequency detector 13 comprises a conventional edge triggered type set-reset flip-flop indicated in dashed rectangle 30. The lower frequency oscillator signal from the source 12 is applied to the set terminal of flip-flop 30 and the higher frequency oscillator signal from the source 11 is coupled to the reset terminal. Flip-flop 30 produces an output pulse which rises at the leading edge of an input pulse at the lower frequency and falls at the leading edge of the next pulse at the higher frequency (see FIGS. 4*a* to 4*c*). The period of the output from flip-flop 30 depends on the phase difference between the two oscillation signals and varies with time as illustrated in FIG. 4*c*. A linear integrator 31 is coupled to the output of the flip-flop 30. Integrator 31 comprises field-effect transistors 32, 33 and 34 having their source and drain electrodes connected in series across the terminals of a DC voltage source. The first field-effect transistor 32 has its gate electrode coupled to its source electrode to form a constant current supply circuit. The second transistor 33 has its gate electrode connected to the output of flip-flop 30 and its drain electrode coupled to a storage capacitor 35. The third transistor 34 has its gate electrode connected to the low frequency source 12 by way of an invertor 36, and serves to discharge capacitor 35. The output from flip-flop 30 causes the second transistor 33 to be gated into conduction, thereby establishing a constant flow of current from transistor 32 into capacitor 35, which therefore is charged linearly with time during the time that flip-flop 30 output is high in level. At the trailing edge of the lower frequency pulse which initiates charging of capacitor 35, the third transistor 34 will be gated into conduction. This establishes a discharge path, the charge stored on the capacitor 35 flowing rapidly through transistor 34 to ground. The voltage developed across capacitor 35 has the waveform shown in FIG. 4*d*. The phase difference between the two oscillation signals thus produces pulses whose waveshape is determined by the phase difference between the two oscillation signals.

The integrator output is connected to a low pass filter 37 which filters out frequency component other than the fundamental frequency of the periodic signal at the output of integrator 31. FIG. 4*e* illustrates that the fundamental frequency component of the filtered signal has a sinusoidal waveform. This sinousoidal waveform output is applied to a pulse shaping circuit 38, consisting of a series-connected unity-gain inverting amplifiers. The inverting amplifiers provide an output having a sharp characteristic change in amplitude at a predetermined thereshold level of input signal. Since a single output pulse is generated from the pulse shaping circuit 38 for every 16 higher frequency pulses or 3 lower frequency pulses, *n* outputs from circuit 38 occur for every $$16 \times n \left(= n \sum_{i=1}^{n} qi + n\right)$$

higher frequency pulses.

For every n output pulses from pulse shaping circuit 38, only one output pulse is generaed by the $1/n$ frequency divider 14. The frequency-divider output is coupled to an Exclusive-OR gate 15, to which is also connected the lower frequency pulses from source 12. The output of Exclusive-OR gate 15 goes high only when either one of the two inputs is high and goes low when both of the inputs are at the same signal level. Therefore, one additional pulse is generated and inserted into the train of lower frequency pulses fromm the output of the Exclusive-OR gate 15 for every 80 ($=16 \times 5$) higher frequency pulses thereby correcting for the frequency deviation. The output of Exclusive-OR gate 15 is connected to the frequency divider stages of an electronic timepiece (not shown), to generate various timekeeping pulses therefore.

Figure 5:
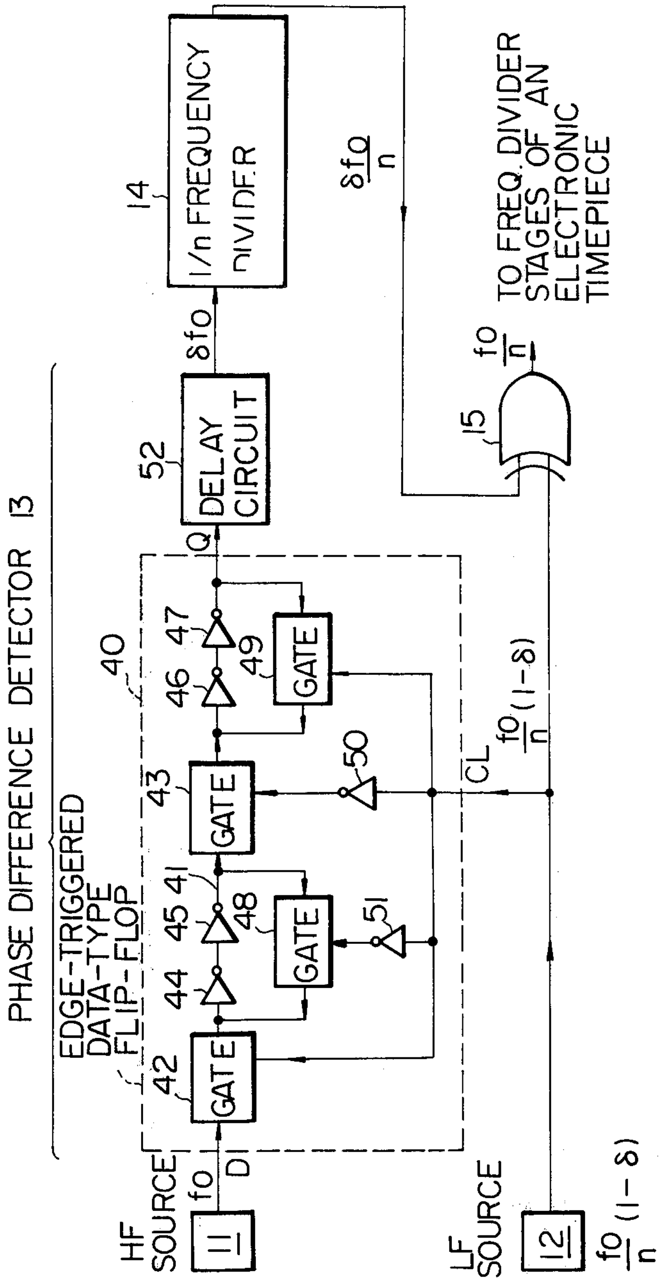
FIG. 5 is a second embodiment of the invention.
Figure 6:
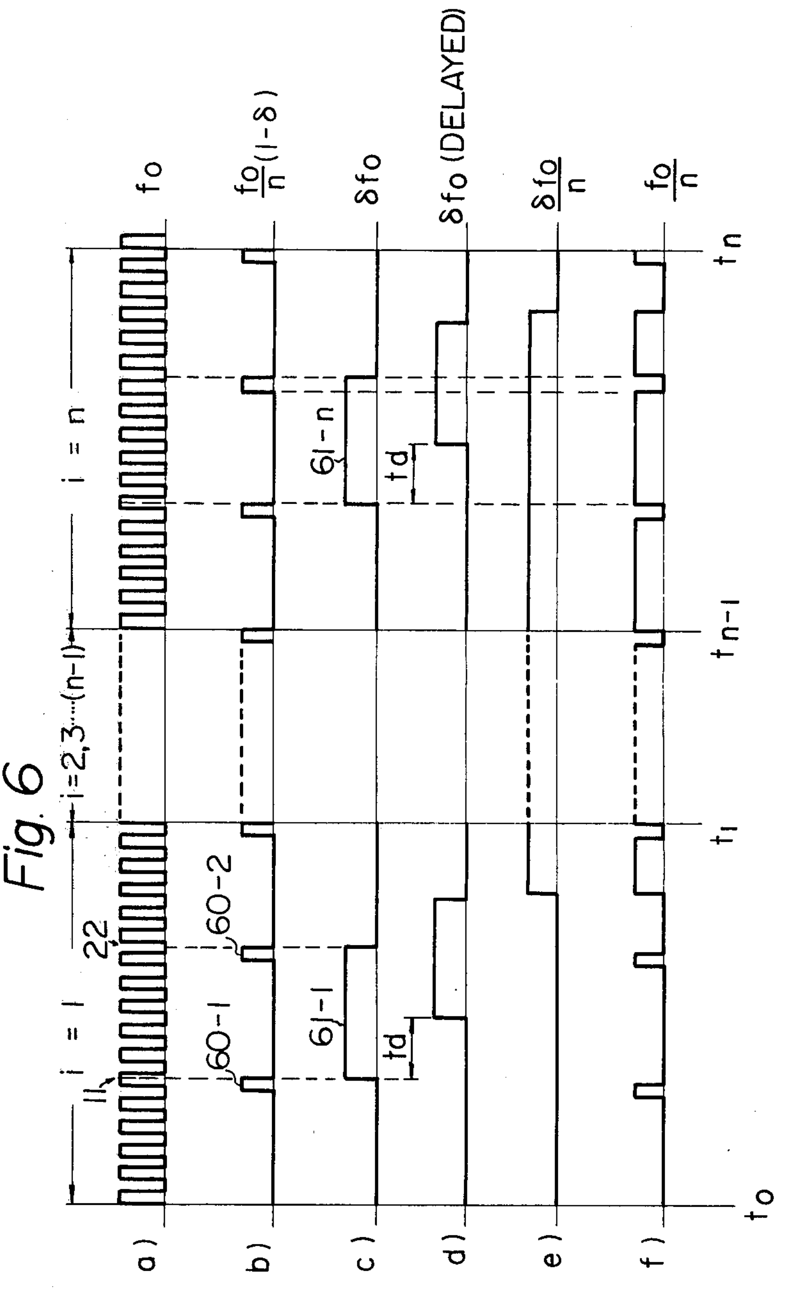
FIG. 6 is an explanatory waveform diagram for the second embodiment of FIG. 5.

A second embodiment of the present invention is illustrated in FIG. 5 and will be explained with reference to FIG. 6 and Tables 1 and 2. The circuit shown in FIG. 5 comprises a high frequency signal source 11 and a low frequency signal source 12. The sources 11 and 12 generate signals at the same frequencies as in the previous embodiment, but the signal at the lower frequency has a pulse duty cycle of considerable less than 50%, to reduce time intervals in which the higher frequency signal passes through the flip-flop 40 to thereby minimize power requirement. The signal at the higher frequency is applied to the data input terminal of a data-type edge-triggered flip-flop 40. Flip-flop 40 comprises a data channel 41 which includes transmission gates 42 and 43, a first pair of unity-gain inverting amplifiers 44, 45 connected between the output and input of gates 42 and 43 respectively, and a second pair of unity-gain inverting amplifiers 46, 47 connected between the output of gate 43 and the Q output terminal of the flip-flop 40. A first feedback transmission gate 48 is coupled in parallel with the first inverter pair 44, 45 to provide a first feedback memory path, and a second feedback transmission gate 49 is coupled in parallel with the second inverter pair 46, 47 to provide a second feedback memory path. The signal at the lower frequency is applied directly to the control terminals of gates 42 and 49, and through inverters 50 and 51 to the control terminals of gates 43 and 48, respectively. The connection between low frequency signal source 12 and flip-flop 40 serves to trigger this flip-flop and the corresponding terminal is therefore termed the trigger or clock input terminal of the flip-flop.

Assuming that a phase difference exists between the high and low frequency signals, the operation of data-type flip-flop 40 will be as follows: In FIG. 6, the signal applied to the data input terminal of flip-flop 40 may be designated by the term "data bits", and the signal applied to the clock input by the term "clock bits". The data bits change between the logic levels "1" and "0" at the higher frequency rate, while the clock bits occur at the lower frequency, with the same frequency relationship to the higher frequency as in the previous embodiment. The relation between the data and clock bits is illustrated in Table 1, which shows that as the data bits alternate between the high and low logic levels the clock bits continues at the "0" level until the tenth data bit. While "0" level bits are applied to the clock terminal, gates 42 and 49 are inhibited and the Q output terminal remains at the "0" logic level. When a "1" bit is applied to the clock terminal, gates 42 and 49 are rendered conductive. The high frequency binary signal is gated through the conducting gate 42 and applied to the first memory loop consisting of invertor pair 44, 45 and gate 48, which is now inhibited. Gate 49 will pass a feedback current if, at the instant when it is rendered the conducting, the level of output Q is "1". If this is not the case, then the Q output is maintained at the "0" level. While gate 42 is conducting, if a "1" input is applied to the data input terminal, the output of the inverter pair 44, 45 will be brought to the "1" level. However this is blocked off by gate 43 since it is inhibited. This is the condition at the 11th data bit. With the data bit at "1", the clock bit changes to "0" in the second half period of the 11th data bit. When this occurs, gate 48 is rendered conducting, causing the corresponding feedback memory loop to thereby maintain its output at the "1" level. This is gated through the now conducting gate 43 and is passed through the second inverter pair 46, 47 to output terminal Q. The Q output is thus brought to the "1" level at the trailing edge of the lower frequency pulse 60-1 as illustrated in FIG. 6*b*. During the subsequent period ranging from the 12th to the first half period of the 21st bit of data input, the clock input remains at the "0" level and gates 48 and 43 are maintained conducting, thereby producing a "1" logic output on the Q output terminal. During the second half period of the 21st data bit, the clock bit changes to "1", thus causing gates 43 and 48 to be inhibited, while causing gates 42 and 49 to be made conducting. Gate 42 therefore now allows a new "1" bit to be passed to the inverter pair 44, 45, while the conducting state of gate 49 establishes a new feedback loop and delivers a "1" output to output terminal Q. This condition will continue until the first half period of the 22nd bit of data input. During the second half period of the 22nd bit, the clock bit signal changes to the "0" level. The feedback path through gate 49 is blocked off, and gates 43 and 48 are rendered conducting. With a "0" data bit applied, the now conducting gate 48 produces a "0" output which is gated through the now conducting gate 43 to output terminal Q. It is understood that output Q falls to zero at the trailing edge of the lower frequency pulse 60-2 (FIG. 6*b*). An output pulse 61-1 (FIG. 6*c*) is thus delivered from flip-flop 40 to a delay circuit.

Tables 1 and 2 show a sequence of data and clock bits for explanation of the second embodiment.

TABLE 1

| BIT NO. | DATA BIT | CLOCK BIT | OUTPUT |
|---|---|---|---|
| 1 | 1 | 0 | 0 |
| 2 | 0 | 0 | 0 |
| 3 | 1 | 0 | 0 |
| 4 | 0 | 0 | 0 |
| 5 | 1 | 0 | 0 |
| 6 | 0 | 0 | 0 |
| 7 | 1 | 0 | 0 |
| 8 | 0 | 0 | 0 |
| 9 | 1 | 0 | 0 |
| 10 | 0 | 0 | 0 |
| | 0 | 0 | 0 |
| 11 | 1 | 1 | 0 |
| | 1 | 0 | 1 |
| 12 | 0 | 0 | 1 |
| 13 | 1 | 0 | 1 |
| 14 | 0 | 0 | 1 |
| 15 | 1 | 0 | 1 |
| 16 | 0 | 0 | 1 |
| 17 | 1 | 0 | 1 |
| 18 | 0 | 0 | 1 |
| 19 | 1 | 0 | 1 |
| 20 | 0 | 0 | 1 |
| 21 | 1 | 0 | 1 |
| | 1 | 1 | 1 |
| 22 | 0 | 1 | 1 |
| | 0 | 0 | 0 |
| 23 | 1 | 0 | 0 |

TABLE 2

| BIT NO. | DATA BIT | CLOCK BIT | OUTPUT |
|---|---|---|---|
| | 0 | 0 | 0 |
| 10 | 0 | 1 | 0 |
| 11 | 1 | 1 | 0 |
| 12 | 0 | 0 | 0 |

From an examination of Table 1 it will be understood that when the clock bit changes from "1" to "0", output Q of data flip-flop 40 rises to the "1" logic level during the occurrence of a "1" data bit, and falls to the binary level during the occurrence of a "0" data bit.

If there is no phase difference between the two signals from sources 11 and 12, the clock bit at the 11th data bit will become as illustrated in Table 2. No change occurs in the binary state of output Q of flip-flop 40, since the change of clock bit from "1" to "0" only occurs after the completion of a change in the data bit state from "1" in the 11th bit to "0" in the 12th bit.

Pulse 61-1 is delayed by the time interval $t_d$ as illustrated in FIG. 6*d* to perform arithmetic operations in a reliable manner and applied to frequency divider 14 where the input pulses are counted down by the factor "*n*" to give an output frequency 1/*n* times the input frequency. In a similar manner to that described previously, the output from frequency divider 14 is applied to one input of an algebraic adding circuit formed by Exclusive-OR gate 15, to the other input of which is applied the signal from the lower frequency signal source 12. The time of occurrence of a delayed pulse 61-n once for every *n* pulses of the series 61-1 to **61-*n*** in FIG. 6*c* is illustrated in FIG. 6*e*. The resultant output waveform from Exclusive-OR gate 15 will appear as illustrated in FIG. 6*f*.

As previously described, it is essential that the duty cycle of the lower frequency pulse (clock input) be as low as possible, from the standpoint of power requirements. This will be understood by assuming that if the clock input starts to rise to the "1" binary level at the 5th data bit rather than at the 10th data bit, a current will circulate through the feedback loop which includes gate 48 of flip-flop 40, during the 5th, 7th and 9th data bits, and power will consequently be dissipated unnecessarily.

It will be appreciated that the use of a data-type flip-flop constructed as shown in FIG. 5 results in lower power dissipation and fewer of circuit components being required.

Figure 7:
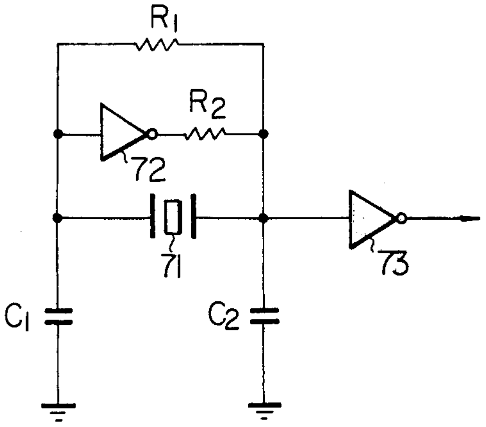
FIG. 7 to 9 illustrate examples of lower and higher frequency signal sources.

The crystal oscillator of FIG. 7 may be employed as the lower frequency signal source 12. The frequency generated by a crystal resonator depends on the cutting angle, shape and dimensions of the crystal. The oscillator of FIG. 7 comprises a crystal resonator 71 cut at an angle of +5°, and a unitygain inverting amplifier 72 connected in series with a resistor $R_2$ across the crystal 71 providing an oscillating loop. The crystal 71 is further shunted by a direct-current feedback resistor $R_1$ of approximately 10 megohms. A capacitor $C_1$ is connected between one terminal of the crystal and reference potential or ground and a capacitor $C_2$ between the other terminal and ground. A signal at a frequency of about 32 kHz can be obtained at the output of inverter 73 when $C_1$ and $C_2$ have capacitances of 10 picofarads and 5 picofarads, respectively, and $R_2$ has a resistance of 300 kilohms. The output inverter 73 has unity gain, and serves to provide waveshaping of the oscillator output signal, to deliver a train of pulses with a 50% duty cycle.

Figure 10:
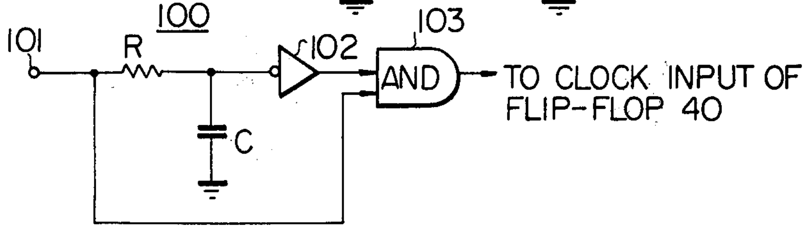
FIG. 10 illustrates the circuit of a duty-cycle convertor.

These 50% duty cycle pulses can be converted to lower duty cycle pulses by a converter as shown in FIG. 10, to serve as the lower frequency source of the embodiment shown in FIG. 5. The duty cycle converter 100 comprises an input terminal 101 to which is applied a train of pulses at 50% duty cycle supplied from the oscillator of, for example, FIG. 7, an RC circuit and a unity-gain inverting amplfier 102. The resistor R is connected in series between the input terminal 101 and the inverter 102 input, and the capacitor C is connected between a point intermediate the resistor R and the inverter input and ground. The capacitor C will develop a voltage which rises exponentially at a rate determined by the RC time constant. The inverter 102 produces an output which sharply changes in amplitude relative to a predetermined input voltage level, so that when the input level is above the preset value the inverter 102 output goes to a negative potential and returns to the original level when the input goes below that preset value. The leading edge of the inverter output therefore occurs after a slight delay with respect to the leading edge of the applied pulse. The output of the inverter 102 is connected to an AND gate 103 to which are also applied the 50% duty cycle pulses. AND gate 103 thus produces a train of pulses each of which begins at the leading edge of an input 50% duty-cycle pulse and ending at the leading edge of the delayed negative-going pulse from inverter 102. The duty cycle of the output pulses from AND gate 103 can be selected as required by varying the RC time constant value.

Figure 8:
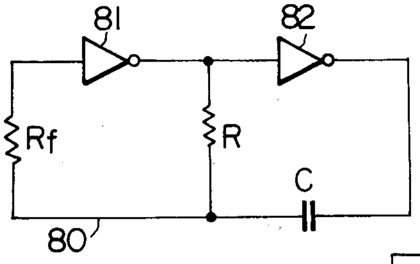

FIG. 8 is another example of a lower frequency source 12 using a CR oscillator comprised of complementary MOS transistor circuitry. The use of a CMOS oscillator as a lower frequency source permits it to be advantageously integrated with other circuits of an electronic timepiece. The CR oscillator of FIG. 8 comprises a closed circuit path 80 which includes a pair of series-connected unity-gain inverting amplifiers 81 and 82, a resistor $R_f$ and a capacitor C connected in series thereto. A resistor R is connected from the output of inverter 81 to the junction of resistor $R_f$ and capacitor C. Assuming that the output of inverter 82 is at the high level, capacitor C will be charged up to the supply voltage and inverter will 81 produce a low level output. The capacitor C will then be discharged through resistor R. The change in voltage across the capacitor C as it discharges will cause a corresponding variations in the voltage applied to the input to the inverter 81. When a predetermined voltage level is reached, inverter 81 will produce a high level output causing inverter 82 to produce a low level output. Capacitor C will then start to change, and with this the voltage at the input of inverter 81 will decrease. Again, when a predetermined voltage level is reached, a sharp change in voltage occurs at the output of inverter 81. This process will be repeated and a train of square wave pulses thereby is generated.

Figure 9:
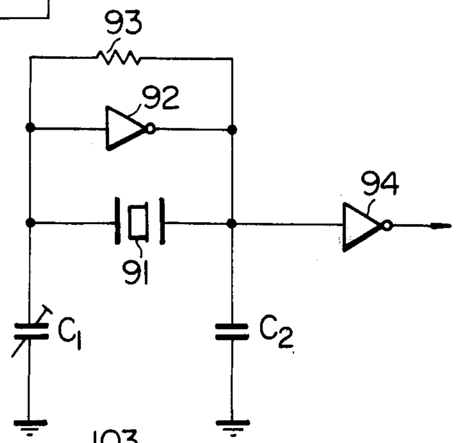

FIG. 9 is an example of a 4 MHz oscillator which may be used to serve as a higher frequency source. Numeral 91 is an AT cut crystal resonator, 92 a CMOS unity-gain inverting amplifier, and 93 a direct-current feedback resistor (10 megaohms for supply voltage of 1.5 volts). Oscillation at a frequency of 4 MHz occurs for the values $C_1$ = 20 picofards, $C_2$ = 5 picofards. The oscillator or output voltage is shaped into square wave pulses by the inverter 94.

Test has revealed that when a high frequency signal of $2^{22}$ Hz and a low frequency signal at a frequency between 32,660 Hz and 32,760 Hz are used and an output of the frequency divider is divided by 128, it is possible to obtain an output signal at a frequency of 32,768 Hz even in a case where the frequency deviation in the low frequency signal is in the range of 100 Hz due to temperature variations. This means that in accordance with the present invention an accurate time standard signal can be obtained by using a low frequency signal source of a relatively low stability.

Figure 11:
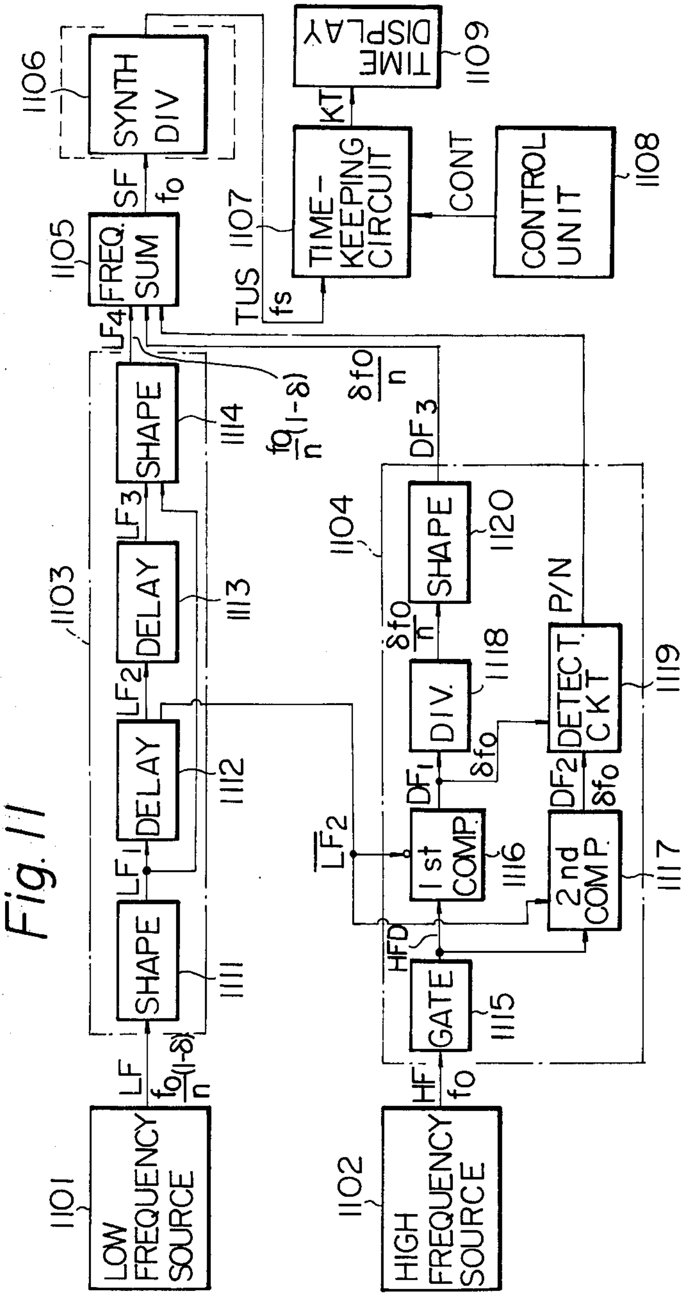
FIG. 11 shows a block diagram of a third preferred embodiment of the present invention.

FIG. 11 shows a block diagram of a third preferred embodiment of the present invention. In this illustrated embodiment, a frequency standard for an electronic timepiece comprises a low frequency signal source 1101 and a high frequency signal source 1102. The low frequency signal source 1101 generates electrical oscillation signals LF, which are applied to a wave shaping circuit section 1103. The wave shaping circuit section 1103 comprises a first wave shaping circuit 1111 to shape the waveform of the input signal from the low frequency source 1101 into a rectangular shape to provide an output signal LFI, which is applied though delay circuits 1112 and 1113 to a second wave shaping circuit 1114. The second wave shaping circuit 1114 serves to shape the delayed pulses into output pulses of narrow pulse width without changing the frequency thereof.

The high frequency signal source 1102 generates electrical oscillation signals HF at a frequency $f_0$. These signals HF are applied to a phase difference detector 1104 to generate an output signal indicative of any phase difference between high frequency signal HF and low frequency signal LF. The phase difference detector 1104 comprises a gate circuit 1115 to produce an equivalent input frequency to be applied to subsequent circuits with a view to minimizing power consumption. The gate circuit 1115 generates an output signal HFD representative of the product of the low frequency signal LF2 supplied from the wave shaping circuit section 1103 and the high frequency signal HF. The output signal HFD is applied to first and second phase comparators 1116 and 1117, to which inverted low frequency signal LF2 having a duty cycle considerably less than 50% is also applied. Each of these phase comparators comprises a data type flip-flow which will assume the state of the input data line (to which is applied high frequency signal HF) at a transition between logic levels of the low frequency signal LF applied to the control terminal of the flip-flop. Thus, the first and second comparators 1116 and 1117 generate output signals DF1 and DF2, respectively, indicating the phase difference between the low frequency and the high frequency signals. The output signals DF1 and DF2 are applied to a detecting circuit 1119 which determines the positive or negative value of the output signals from the first and second comparators 1116 and 1117. The detecting circuit 1119 generally comprises a counter circuit which is arranged to measure the frequency or period of one of the low and high frequency signals based on another of the low and high frequency signals and stores the measured result. Here, by "phase difference" is meant the difference between the frequency of the high frequency signal and the product of the frequency of the low frequency signal and an integral multiple. If the phase difference signal is stable and very small, a lower value of maximum count for the counter circuit mentioned above may be utilized to calculate the phase difference. In more simplified form, a circuit which detects a logic level transition of one bit may be utilized in the first and second comparators 1116 and 1117 and the detecting circuit 1119.

The output signal DF1 is also applied to a $1/n$ frequency divider 1118, $n$ being an integral multiple determined by the frequency ratio of the low and high frequency signals LF and HF. Output pulses from the frequency divider 1118 are applied through a pulse shaping circuit 1120 to an algebraic summing circuit 1105. THe pulse shaping circuit may be dispensed with but it will be necessary for any other construction to satisfy the conditions for waveform and phase of the input pulses required by the algebraic summing circuit 1105.

Assuming that the frequency of the low frequency signal LF is $f_L$ and the frequency of the high frequency signal HF is $f_H = fo$, the actual frequency $f_L$ of the low frequency signal LF is expressed by $$f_L = \frac{f1}{n}(1 - \delta)$$

where $\delta$ is the factor of frequency deviation from a predetermined frequency of the low frequency signal LF and $|\delta| << 1$. The frequency $f_{L4}$ of the output pulses LF4 of the wave shaping circuit section 1103 is equal to the frequency $f_L$ and, therefore, the frequency $f_{14}$ is expressed by $$f_{L4} = \frac{fo}{n}(1 - \delta)$$

The frequency $f_{DF1}$ of the output pulses DF1 of the phase difference detector 1104 is equal to the frequency $\delta fo$ of the output signal DF1 and, therefore, the frequency $f_{DF1}$ is expressed by $$f_{DF1} = \delta fo$$

The output DF3 of the phase difference detector 1104 will be referred to as a phase difference signal hereinafter. The output signal P/N from the phase difference detector 1104 takes a positive or negative value, to indicate the phase difference. The phase difference signal may have either one of positive and negative values and will be generated only when the absolute value $\delta fo$ is less than $f_L/2$. The polarity of the phase difference signal is indicated by the P/N signal from the detecting circuit 1119. When the P/N signal is at the high level, the phase difference has a positive value and, accordingly, the phase difference signal $f_{DF3}$ is added to the absolute value $f_{L4}$ in the algebraic summing circuit 1105 to produce an output signal SF of frequency $f_{SF}$ with the value $(|f_{L4}|+|f_{DF3}|)$. When, however, the P/N signal is at the low level, the phase difference has a negative value and, accordingly.

$$f_{SF} = (|f_{L4}| - |f_{DF3}|)$$

The output signal SF is applied to a synthesizer or frequency divider 1106 which divides down the input frequency to a produce a time unit signal TUS (of frequency $f_{TUS}$). This time unit signal is applied to a timekeeping circuit 1107 connected to a time display device 1109. Indicated by 1108 is a control unit which generates a control signal CONT to control the timekeeping circuit 1107 in a manner to be discussed later.

Figure 12A:
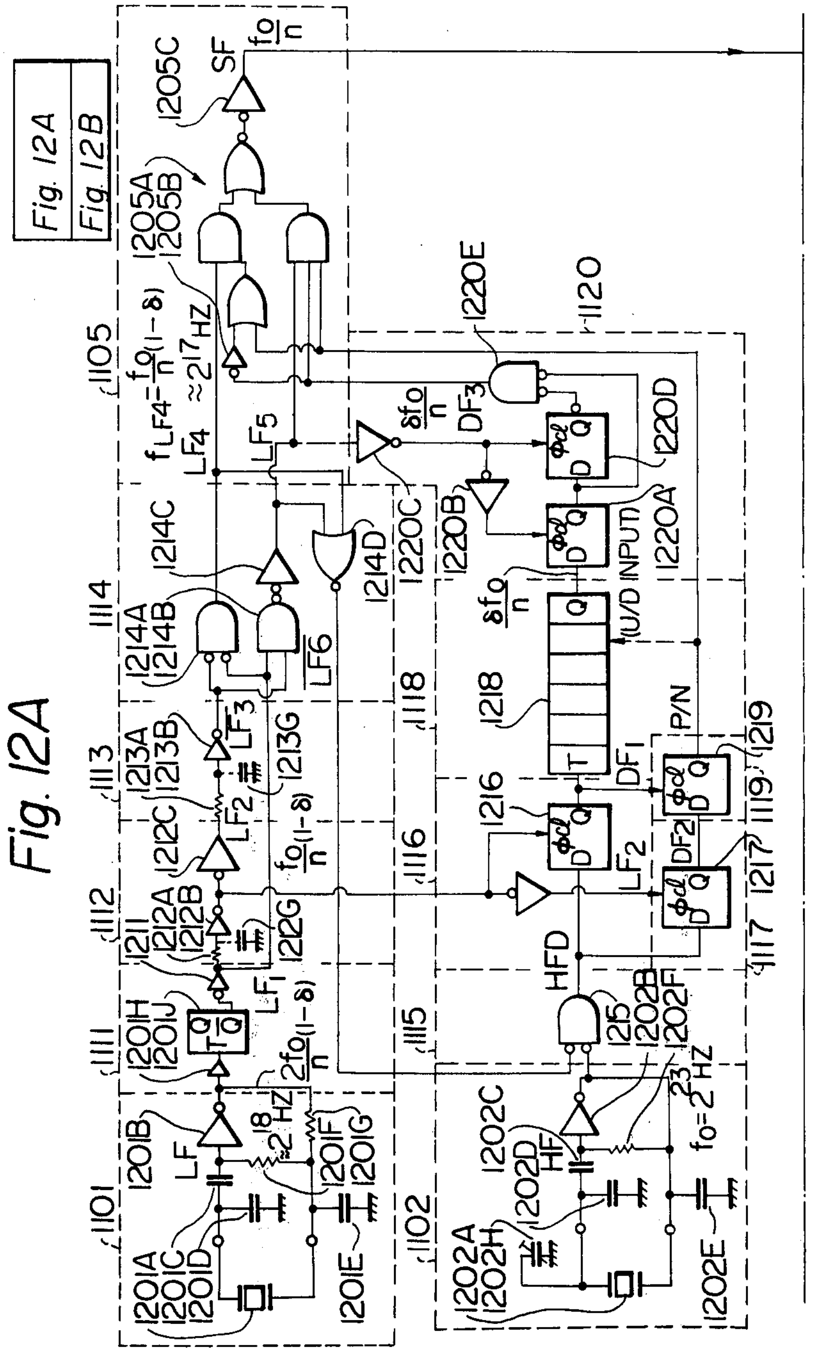
FIGS. 12A and 12B show a detail circuitry for the block diagram shown in FIG. 11.
Figure 12B:
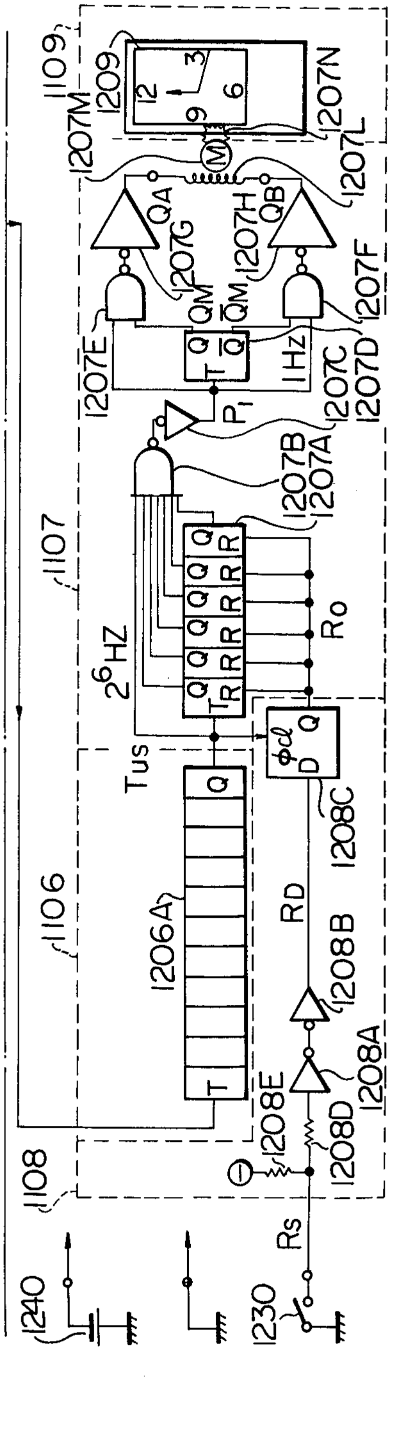

FIG. 12 shows a detail circuitry for the block diagram of FIG. 11. In FIG. 12, the low frequency signal cource 1101 comprises a quartz crystal oscillator 1201A oscillating at a frequency of $2^{18}$Hz. One terminal of the quartz crystal oscillator 1201A is connected to an amplifier comprised of a capacitor 1201C and a complimentary MOSFET inverter 1201B, by which a $\pi$ type resonator circuit comprised of the quartz crystal oscillator 1201A, and capacitors 1201D and 1201E is energized to provide a signal of stable frequency at $2^{18}$ Hz.

The high frequency signal source 1102 comprises a quartz crystal oscillator 1202A oscillating at a frequency of $2^{23}$Hz (about 8 MHz). The quartz crystal oscillator 1202A and capacitors 1202D and 1202E form a $\pi$ type resonace circuit, which is energized by an amplifier comprised of a resistor 1202F, a capacitor 1202C and an inverter 1202B to provide a signal at an accurate frequency of $2^{23}$Hz. Indicated as 1202H is a capacitor for frequency adjustment.

Figure 13A:
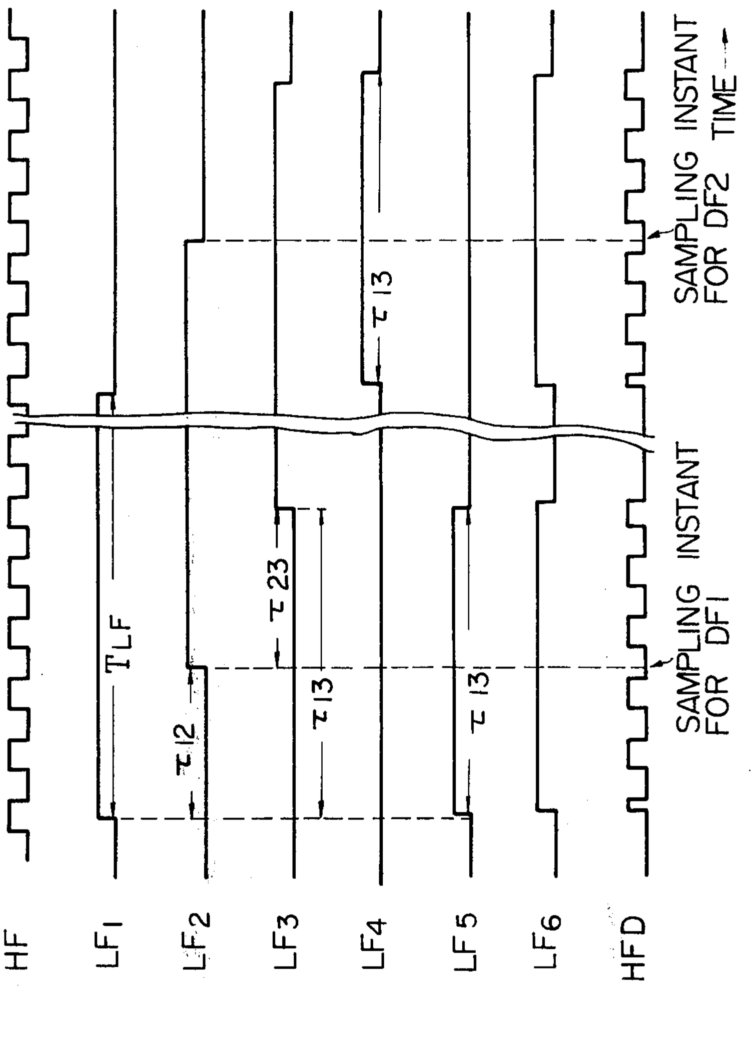
FIGS. 13A to 13D show explanatory waveform diagrams for the embodiment of FIGS. 12A and 12B.

The output frequency of the low frequency signal source 1101 is applied to the pulse shaping circuit 1111, which comprises an inverter 1201H to shape the waveforms of the output frequency applied thereto. The output of the inverter 1201H is divided by two in a ½ divider 1201J and shaped by inverter 1211 to provide output pulses LF1 at a frequency of $2^{17}$Hz and having a stable pulse duty cycle of  %. This pulse is delayed by delay circuit 1112 comprised of a resistor 1212A, a capacitor 1212G and inverters 1212B and 1212C to provide pulses LF2. These pulses LF2 are delayed by another delay circuit 1113 comprised of a resistor 1213A, a capacitor 1231G and an inverter 1213 to provide a pulse $\overline{LF3}$. The pulses LF1 and $\overline{LF3}$ are applied to pulse shaping circuit 1114. The pulse shaping circuit 1114 comprises a NOR gate 1214A connected to receive the pulses LF1 and $\overline{LF3}$, a NAND gate 1214B connected to receive the pulses LF1 and $\overline{LF3}$, an inverter 1214C connected to the output of the NAND gate 1214B, and a NOR gate 1214D connected to the outputs of the NOR gate 1214A and the inverter 1214C. The leading edge of each output pulse LF4 of the NOR gate 1214A rises in synchronism with the trailing edge of each pulse LF1 and each LF4 pulse has a duration $\tau_{13}$ corresponding to the delay time between the pulses LF1 and LF3. The inverted output pulses LF5 of the NAND gate 1214B rises in synchronism with the leading edge of each of the pulses LF1 and each LF5 pulse has a pulse duration $\tau_{13}$ corresponding to the delay time between the pulses LF1 and LF3. The phase relationship between output pulses LF1, LF2, LF3, LF4, LF5 and $\overline{LF6}$ of the respective inverter 1211, inverter 1212C, inverter 1213B NOR gate 1214A, NAND gate 1214B and NOR gate 1214D is illustrated in FIG. 13A. The frequencies $f_{LF1}$ to $f_{LF5}$ of the output pulses LF1 to LF6, are equal in value and the frequency $f_{LF6}$ is expressed by $$f_{LF6} = f_{LF4} + f_{LF5} = 2f_{LF1}$$

Assuming the delay time between the pulses LF1 and LF2 is $\tau_{12}$, the delay time between the pulses LF2 and LF3 is $\tau_{23}$, the pulse duration of the pulse LF1 is $T_{LF}$ and the pulse duration of the high frequency signal HF is $T_{HF}$, then the following relations can be expressed $$T_{LF} << \tau_{12} < T_{HF}$$

$$T_{LF} << \tau_{23} < T_{HF}$$

If, for example, $T_{LF}$ $\mu$ 8 usec and $T_{HF} \approx 0.12$ $\mu$sec, it may be possible to select the delay time as follows:

$$\tau_{12} \approx 0.2\ \mu\text{sec}$$

$$\tau_{23} \approx 0.2\ \mu\text{sec}$$

Figure 13B:
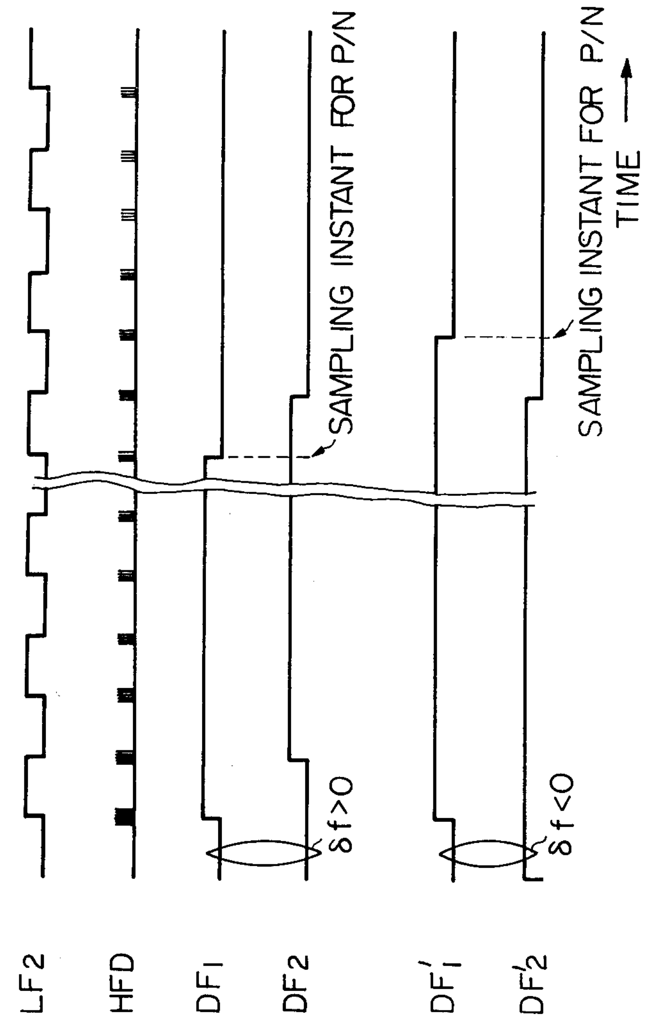

The output pulses LF6 of the NOR gate 1214D and the high frequency signal HF of the high frequency signal source 1102 are applied to a NOR gate 1215 which generates output pulses HFD as shown in FIGS. 13A and 13B. This output signal is a modulated high frequency signal having pulse duration $T_{HF}$ and is generated only when the pulse LF6 is at a high level.

The pulses HFD and LF2 are applied to the data input terminals of first and second comparators 1116 and 1117, each comprising a data type flip-flop having a clock terminals connected to receive the pulse LF2 from the delay circuit 1112. Since the period during which pulses HFD are produced begins and ends with the leading and trailing edges respectively of each LF5 pulse, as shown in FIGS. 13A and 13B, the flip-flops 1216 and 1217 will generate output pulses DF2 as shown in FIG. 13B by sampling the logic level of the pulse HFD at the leading and trailing edges of each pulse LF2, respectively. Each of the pulses DF1 and DF2 indicates a "difference signal".

Assuming the frequencies of the pulses DF1 and DF2 are $f_{DF1}$ and $f_{DF2}$, respectively, the following relations can be expressed $$f_{DF1} = f_{DF2} = f_{HF} - n \cdot f_{LF} = \delta fo \ (<0)$$

The pulses DF1 and DF2 differ only in phase by $\pi$radians, corresponding to time interval $\frac{1}{2}T_{LF}$, i.e., 4 $\mu$sec. If $\delta fo \simeq 1 \times 10^{-6} \times 10^{23} = 1 \times 10^{16}$, the period of the pulses DF1 is 16 $\mu$sec and, accordingly, the phase difference between the pulses DF1 and DF2 is about $\mu/2$ radians. Therefore, each DF2 pulse will rise after $\mu/2$ radians from the leading edge of each DF1 pulse and fall after $\mu/2$ radians from the trailing edge of each DF1 pulse. When $\delta f < 0$, the above relation will be reversed such that the pulse DF1 will rise after 4 $\mu$sec from the leading edge of pulse DF2. The detecting circuit 1119 comprises a data type flip-flop 1219 having its data terminal connected to receive DF2 pulses and its clock terminal connected to receive the DF1 pulses thereby generating a P/N signal as mentioned above. When $\delta fo < 0$, since each pulse DF2 is at the high level at the trailing edge of DF1, the P/N pulse is at a high level, indicating that the low frequency signal LF is lower in frequency than its predetermined frequency. Accordingly, when the P/N signal is at the high level, a pulse is added to the lower frequency signal in the frequency summing circuit 1105. When, however, the P/N signal is at low level, a pulse is subtracted from the low frequency signal. The difference signal DF1 is divided by a frequency divider 1218 to $2^{-6}$ ($2^{17}/2^{23} = 2^{-6}$) to provide a phase difference signal as already mentioned. The phase difference signal is applied to the pulse shaping circuit 1120 comprising first and second data type flip-flops 1220A and 1220D, inverters 1220B and 1220C and NOR gate 1220E. The first data type flip-flop 1220A has its data terminal connected to the output of the frequency divider 1218 and its clock terminal connected to receive pulses LF5 through the inverter 1220B and 1220C. Similarly, the second data type flip-flop 1220D has its data terminal connected to the output of the first data type flip-flop 1220A and its clock terminal connected to receive the pulses LF5 through the inverter 1220C. The NOR gate 1220E is connected at its inputs to the outputs of the first and second data type flip-flops 1220A and 1220D and connected at its output to composite AND-OR gate 1205A through inverter 1205B of the summing circuit 1105. With this arrangement, the pulse shaping circuit 1120 generates an output DF3 which rises in synchronism with the trailing edge of each LF5 pulse and has a pulse duration equal to that ($=\tau_{13}$) of each LF5 pulse. Where $\delta fo$ changes between positive and negative values close to zero, more reliable operation of the circuit can be obtained by replacing the divider 1218 with an up-down counter, which will count "up" and "down" when the P/N signal is at high and low levels, respectively. In the algebraic frequency summing circuit 1105, the input signals LF4 and LF5 have the relationship $$LF4 \cdot LF5 = b\ 0 \text{ (low level)}$$

Accordingly, the computation of (LF4 + LF5) can be made by using an OR gate. When DF3 = 0, the output signal SF is identical to the pulse train LF4. When $DF3 \cdot \overline{P/N} = 1$, the DF3 pulse are substracted from the LF4 pulse train, whereas when $DF3 \cdot P/N = 1$, the DF3 pulse are added to the LF4 pulse train as expressed by $$SF = P/N \cdot DF3 \cdot LF5 + (\overline{\overline{P/N} \cdot DF3}) \cdot LF4$$

Figure 13C:
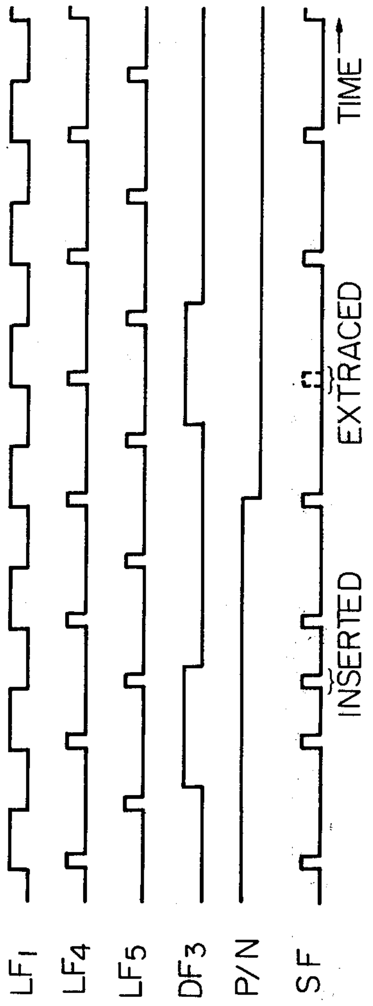

It should be noted that the above equation is an example of algebraic addition of subtraction for obtaining the output pulse SF and various other changes or modifications may be made. The relationship between the input pulses and the output pulses is shown in FIG. 13C.

The output signal SF from the algebraic summing circuit 1105 is applied to the synthesizer or frequency divider 1106, which comprises eleven toggle-type flip-flops 1206A which are cascaded to provide an output Tus at a frequency of $2^6$Hz. This output is applied to the timekeeping circuit 1107 comprised of a counter 1207A and a NAND gate 1207B. The counter 1207A comprises a plurality of toggle-type flip-flops each having a reset terminal connected to the control unit 1108. The counter 1207A counts up to $2^6$, and the NAND gate 1207B and inverter 1207C detect the count of $2^6-1$. The NAND gage 1207B also has applied to its the pulses Tus at a frequency of 64 Hz to generate an output P1 at a frequency of 1 Hz having a pulse duration of 1/128 sec. These output pulses are input to flip-flop 1207D and NAND gates 1207E and 1207F, to which outputs QM and $\overline{QM}$ of the flip-flop 1207D are also input to provide complimentary drive signals. These drive signals are amplified by amplifying inverters 1207G and 1207H to provide complimentary outputs QA and QB which are applied to driving coil 1207L thereby energizing rotor 1207M of a stepping motor. Thus, a gear train 1207N is rotated to actuate hands of a watch, thereby indicating time.

Figure 13D:
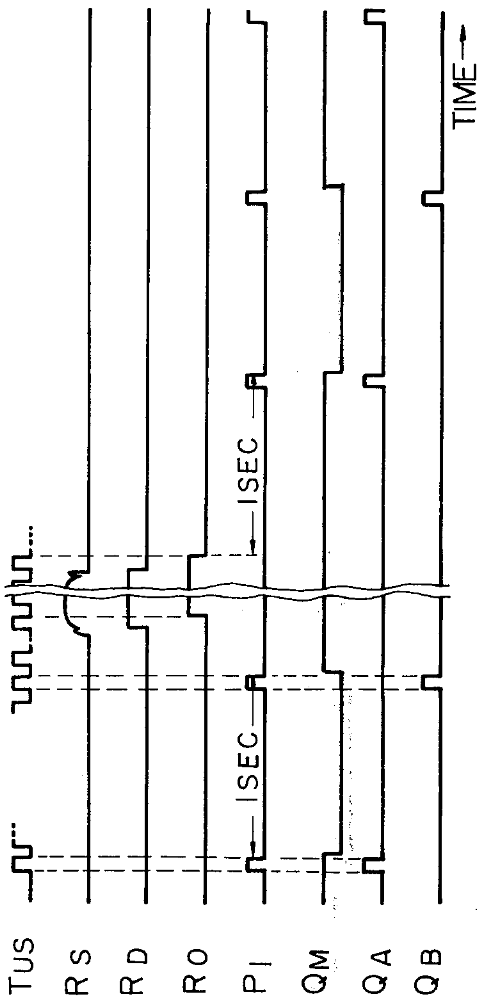

Control switch 1230 is connected to the control unit 1108, which comprise resistors 1208D and 1208E, inverters 1208A and 1208B and a data type flip-flop 1208C. When the switch 1230 is closed, the input signal Rs goes to the high level and is supplied through the resistor 1208D to pulse shaping inverters 1208A and 1208B which provide an output RD. This output is applied to a data terminal of the flip-flop 1208C, to the clock terminal of which is applied the pulses Tus at a frequency of $2^6$ Hz thereby producing an output R*o* synchronizing with the trailing edge of the pulse Tus as shown in FIG. 13D. This output R*o* is applied to the reset terminals of the flip-flops 1207A, where are consequently reset to zero. Thus, the seconds of the watch can be set by time of 1/128 sec. In this illustrated embodiment, the watch advances in time by units of 1/128 sec. and the time display is made by units of one second. Since the counter 1207A is reset in synchronism with the trailing edge of a pulse Tus, an output pulse P1 from the inverter 1207C is reliably held at high level for 1/128 sec and, therefore, the flip-flop 1207D can be actuated thereby preventing the rotor of the stepping motor from being stopped. Indicated as 1240 is a battery, which may be a silver oxide-zinc battery or a lithium battery, discharging at a stable potential for a long period.

While the present invention has been shown and described with reference to a particular embodiment in which an adder circuit is employed to add a phase difference signal to a lower frequency oscillation, it should be noted that a subtraction circuit may also be employed to correct a frequency deviation from a predetermined frequency of the lower frequency oscillation.

What is claimed is:

1. A method for controlling the frequency of first electrical oscillation signals at a predetermined value, comprising the steps of:

generating a second electrical oscillation signal at a frequency higher than the predetermined frequency of the first electrical oscillation signal, generating a train of phase difference signal pulses of which the frequency depends on the frequency departure of said first electrical oscillation signal pulses to the first electrical oscillation signal to provide an output at a frequency of the predetermined value.

2. The method of claim 1, wherein the higher frequency is an integral multiple of the predetermined frequency of the lower frequency oscillation signal and wherein the step of generating phase difference signal oscillations comprises the steps of generating a first train of output signals whose frequency dependents on the number of cycles by which the first electrical oscillation signal has deviated from the predetermined frequency, and dividing the frequency of the first train of output signals by the factor of said integral multiple to obtain said phase difference signal pulses.

3. The method of claim 2, wherein the step of generating said first train of output signals comprises the steps of generating a signal whose frequency depends on the phase difference between the first and second oscillation signals, indicating the last-mentioned signal and filtering out frequency components of the phase difference signal other than the fundamental frequency component.

4. The method of claim 2, wherein the step of generating the first train of output signals includes the steps of generating pulses the leading edge of each of which occurs at the instant of occurrence of a cycle of the first frequency oscillation signal and the trailing edge of each of which occurs at the instant of occurrence of a subsequent cycle of the first frequency oscillation signal at which time the second frequency oscillation signal is at a different level from that at which said leading edge was initiated, and delaying each of said generated pulses by a predetermined period of time.

5. A method for generating electrical oscillation signals at a predetermined frequency, comprising the steps of:

generating a first electrical oscillation signal at a low frequency, generating a second electrical oscillation signal at a high frequency which is an integral multiple of a predetermined frequency of the first electrical oscillation signal;

generating a first pulse train signal during an interval in which the number of cycles of the second electrical oscillation signal is greater or less than the integral multiple of the number of cycles of the first electrical oscillation signal by one cycle of oscillation when the lower frequency deviates from the predetermined value;

frequency dividing the first pulse train signal by said integral multiple to provide phase difference signal pulses; and algebraically adding the phase difference signal pulses to the first electrical oscillation signal.

6. A frequency standard for an electronic timepiece, comprising, means arranged to receive a first electrical oscillation signal at a low frequency and a second electrical oscillation signal at a high frequency for generating phase difference signal pulses of which the frequency depends on the frequency departure of the lower frequency, from its predetermined value, and means for algebraically adding the phase difference signal pulses to the lower frequency oscillator signal to provide an output at a frequency of the predetermined value.

7. A frequency standard as claimed in claim 6, wherein the higher frequency is an integral multiple of the predetermined frequency of the first electrical oscillator signal, and wherein the phase difference signal pulses generating means comprises means for generating a first pulse train whose frequency depends on the number of cycles by which said first-mentioned electrical oscillator signal has deviated from the predetermined frequency, and means for dividing the frequency of first pulse train by said integral multiple to produce said phase difference signal pulses.

8. A frequency standard as claimed in claim 7, wherein the means for generating the first pulse train signal comprises means for generating a signal whose frequency depends on the difference in phase between the first and second electrical oscillation signals, means for integrating the last-mentioned signal, and means for filtering frequency components of the last-mentioned signal other than the fundamental frequency component.

9. A frequency standard as claimed in claim 7, wherein said generating means comprises a flip-flop having a set input terminal connected to be actuated by the lower frequency oscillator signal, a reset input terminal connected to be actuated by the higher frequency oscillation signal and an output terminal providing an output representing the difference in phase between the lower and higher frequency oscillation signals.

10. A frequency standard as claimed in claim 8, further comprising a unity-gain inverting amplifier providing an output having a sharp characteristic change in amplitude with respect to a predetermined input voltage level, the inverting amplifier being connected to produce a train of pulses to serve as the first pulse train signal.

11. A frequency standard as claimed in claim 9, wherein said integrating means comprises a storage capacitor, first, second and third field-effect transistors having their source and drain electrodes connected in series between a first and a second terminal of power source, the first field-effect transistor having its gate electrode connected to one of its source and drain electrodes to function as a constant current supply circuit, the second field-effect transistor having its gate electrode connected to the output of said flip-flop to allow the second field-effect transistor to be gated into conduction to thereby charge said capacitor linearly with time from the constant current supply, and the third field-effect transistor having its gate electrode connected to receive the lower frequency oscillator signal to permit the third transistor to be gated into conduction to discharge said storage capacitor.

12. A frequency standard as claimed in claim 7, wherein the means for generating the first pulse train signal comprises means for generating pulses the leading edge of each of which occurs during a period when said higher frequency oscillator signal is at a first amplitude level and said lower frequency oscillator signal changes from a first to a second amplitude level and the trailing edge of each of which occurs during a period when said higher frequency oscillator signal is at a second amplitude level and said lower frequency oscillator signal changes from the first to the second amplitude levels.

13. A frequency standard as claimed in claim 12, wherein the pulse generating means comprises:

an input terminal connected to receive said higher frequency oscillator signal;

a first transmission gate connected to said input terminal;

a first gated memory loop connected to the first transmission gate;

an output terminal;

a second gated memory loop connected to the output terminal;

a second transmission gate connected between the first and second gated memory loops;

a gate trigger terminal connected to receive said lower frequency oscillator signal said first transmission gate and said second gated memory loop being connected to the gate trigger terminal to be gated into conduction when said lower frequency oscillator signal is at the first amplitude level, and said first gated memory loop and said second transmission gate being connected to the gate trigger terminal to be gated into conduction when said lower frequency oscillator signal is at the second amplitude level.

14. A frequency standard as claimed in claim 13, wherein the interval during which the lower frequency oscillator signal is at the first amplitude level is smaller than the interval during which the same is at the second amplitude level.

15. A frequency standard as claimed in claim 6, wherein said algebraical adding means comprises an Exclusive-OR gate having a first input terminal connected to receive the phase difference signal pulses and a second input terminal connected to receive the lower frequency oscillation signal.

16. A frequency standard for an electronic timepiece, comprising:

a first signal source providing a low frequency oscillator signal;

a second signal source providing a high frequency oscillator signal at an integral multiple of a predetermined frequency of the low frequency oscillator signal, said high frequency oscillator signal serving as a basic timing signal;

means for generating a first pulse train signal during an interval in which the number of cycles of the higher frequency oscillations is greater or less than the integral multiple of the number of cycles of the lower frequency oscillations by one cycle of oscillation when the lower frequency deviates from the predetermined value;

means for frequency dividing the first pulse train signal by the factor of said integral multiple to provide phase difference signal pulses; and means for algebraically adding the phase difference signal pulses to the lower frequency oscillator signal to provide an output of the predetermined frequency.

17. A frequency standard according to claim 16, in which said first and second signal sources are arranged to independently provide said low and high frequency oscillator signals, respectively.

18. A frequency standard for an electronic timepiece, comprising:

first means for generating a first electrical oscillation signal at a low frequency;

second means for generating a second electrical oscillation signal at a high frequency;

third means for generating phase difference signal pulses whose frequency depends on the frequency departure of the first electrical oscillation signal from its predetermined frequency;

fourth means for generating an output signal indicative of a positive or negative value of the phase difference signal pulses;

and fifth means for algebraically adding and subtracting the phase difference signals pulses to and from the first electrical oscillation signal independence on the level of the output signal from the fourth means to provide an output at a frequency of the predetermined value.

19. A frequency standard according to claim 18, in which the frequency of the second electrical oscillation signal is an integral multiple of the predetermined frequency of the first electrical oscillation signal.

20. A frequency standard according to claim 19, in which said third means comprises means connected to receive the first and second electrical oscillation signals for generating a first signal whose frequency depends on the difference in phase between the first and second electrical oscillation signals, and means for dividing the first signal by the integral multiple to produce the phase difference signal pulses.

21. A frequency standard according to claim 20, in which said fourth means comprises means connected to receive the first and second electrical oscillation signals for generating a second signal whose frequency depends on the difference in phase between the first and second electrical oscillation signals, and means connected to receive the first and second signals for generating the output signal.

22. A frequency standard according to claim 19, in which said fifth means comprises first gate means for algebraically adding the phase difference signal pulses to the first electrical oscillation signal when the output signal is at high level, and second gate means for algebraically subtracting the phase difference signals pulses from the first electrical oscillation signal when the output signal is at low level.

* * * * *